United States Patent
Rommeveaux et al.

(10) Patent No.: US 7,737,000 B2
(45) Date of Patent: Jun. 15, 2010

(54) PROCESS FOR THE COLLECTIVE FABRICATION OF MICROSTRUCTURES CONSISTING OF SUPERPOSED ELEMENTS

(75) Inventors: Philippe Rommeveaux, Coublevie (FR); Bernard Aspar, Rives (FR)

(73) Assignees: E2V Semiconductors (FR); Tracit Technologies (FR)

( * ) Notice: Subject to any disclaimer, the term of this patent is extended or adjusted under 35 U.S.C. 154(b) by 409 days.

(21) Appl. No.: 11/721,928

(22) PCT Filed: Dec. 8, 2005

(86) PCT No.: PCT/EP2005/056599

§ 371 (c)(1),
(2), (4) Date: Jun. 15, 2007

(87) PCT Pub. No.: WO2006/063961

PCT Pub. Date: Jun. 22, 2006

(65) Prior Publication Data
US 2009/0275152 A1 Nov. 5, 2009

(30) Foreign Application Priority Data
Dec. 15, 2004 (FR) .................................. 04 13345

(51) Int. Cl.
*H01L 21/00* (2006.01)
(52) U.S. Cl. ................. 438/460; 438/458; 257/E21.122
(58) Field of Classification Search ................. 438/113, 438/460, 455, 464, 462, 68, 33, 458; 257/E21.701, 257/E21.599, E21.122, E27.161, E27.144, 257/E27.137
See application file for complete search history.

(56) References Cited

U.S. PATENT DOCUMENTS

| | | | | |
|---|---|---|---|---|
| 5,668,033 A | * | 9/1997 | Ohara et al. | 438/113 |
| 6,040,235 A | | 3/2000 | Badehi | |
| 6,407,381 B1 | | 6/2002 | Glenn et al. | |
| 6,555,901 B1 | | 4/2003 | Yoshihara et al. | |
| 7,444,873 B2 | * | 11/2008 | Robert | 73/514.32 |
| 2002/0170175 A1 | | 11/2002 | Aigner et al. | |
| 2002/0172327 A1 | * | 11/2002 | De Groot | 378/146 |
| 2004/0012698 A1 | * | 1/2004 | Suda et al. | 348/315 |
| 2004/0251790 A1 | * | 12/2004 | Masuko et al. | 310/348 |
| 2006/0141760 A1 | * | 6/2006 | Brandl et al. | 438/612 |

FOREIGN PATENT DOCUMENTS

WO 2004008522 1/2004

* cited by examiner

*Primary Examiner*—Davienne Monbleau
*Assistant Examiner*—Shweta Mulcare
(74) *Attorney, Agent, or Firm*—Lowe Hauptman Ham & Berner, LLP (57) ABSTRACT

The invention relates to the collective fabrication of superposed microstructures, such as an integrated circuit and a protective cover. Individual structures each comprising superposed first and second elements are fabricated collectively. The first elements (for example, integrated circuit chips) are prepared on a first plate and the second elements (for example, transparent covers) are prepared on a second plate. The plates are bonded to each other over the major portion of their facing surfaces, but with no bonding of the defined zones in which there is no adhesion. The individual structures are then diced via the top on the one hand and via the bottom on the other hand along different parallel dicing lines passing through the zones with no adhesion, so that, after dicing, the first elements retain surface portions (those lying between the parallel dicing lines) that are not covered by a second element. A connection pad may thus remain accessible at this point.

20 Claims, 7 Drawing Sheets

PROCESS FOR THE COLLECTIVE FABRICATION OF MICROSTRUCTURES CONSISTING OF SUPERPOSED ELEMENTS

CROSS-REFERENCE TO RELATED APPLICATIONS

The present Application is based on International Application No. PCT/EP2005/056599, filed on Dec. 8, 2005, which in turn corresponds to France Application No. 0413345 filed on Dec. 15, 2004, and priority is hereby claimed under 35 USC §119 based on these applications. Each of these applications are hereby incorporated by reference in their entirety into the present application.

FIELD OF THE INVENTION

The invention relates in general to the collective fabrication of superposed bonded microstructures and applies in particular to the fabrication of integrated electronic circuits, and by extension to micromachined structures fabricated using collective processes similar to those employed in the fabrication of integrated electronic circuits. These micromachined structures are known by the name MEMS when they incorporate electrical and mechanical functions (for example pressure microsensors, acceleration microsensors, etc.) and MOEMS when they incorporate electrical and optical functions (image sensors, displays).

BACKGROUND OF THE INVENTION

To make the invention more clearly understood, and merely by way of example, the application to the fabrication of an electronic image sensor will be described more precisely. An electronic image sensor is typically intended for example to form the core of a digital camera. It converts an image projected on its sensitive surface into electrical signals.

Conventionally, the image sensor is a monolithic electronic integrated circuit formed on a silicon substrate. Formed on the surface of this substrate are, on the one hand, a matrix of photodetectors and, on the other hand, peripheral electronic circuits called "drivers". The drivers are used to drive the matrix and extract and process the signals which are output by the matrix and which represent, in electronic form, the image projected on the matrix by an objective.

The monolithic integrated circuit is therefore intended to be combined, in the camera, with a projection optic (a lens or several superposed lenses) that projects the image to be detected on the photosensitive surface of the matrix. This projection optic may form part of the sensor, that is to say it may be integrated with the sensor placed in front of the upper surface thereof, or it may be separate and form part of the camera. However, even if it is separate, it may be useful to provide, on the sensor itself, another optical element, such as a transparent protective wafer or optical filter, mounted directly on the sensor during its fabrication. This is the case not only for photography in the visible range, but it is also for example the case in the field of X-ray imaging, in which it may be desirable to mount, on the sensor, during fabrication of the latter, a wafer of scintillator material, and optically a fiber optic wafer between the scintillator and the matrix of photodetectors.

Thus, examples may be given in which it is useful to combine, with an integrated circuit having electronic functions, a mechanical or optical structure that does not initially form part of the same substrate as the actual integrated circuit, but which has to be attached to this substrate during its fabrication. The simplest example is the transparent wafer on an image sensor, and the explanation will continue with regard to this simple case, although the invention applies to the other structures mentioned above (lenses, fiber wafers, etc.) or even a simple protective cover, whether transparent or not, or a superposition of electronic circuit plates. It will be seen that this transfer of a protective plate or of another structure onto the integrated circuit has hitherto posed problems, and the present invention is aimed at solving these problems.

Conventionally, the fabrication of an integrated circuit is carried out collectively starting from a silicon wafer. A multiplicity of identical individual integrated circuits, arranged in an array of rows and columns, is formed on this wafer by successive operations, namely deposition of layers, photolithography of these layers and chemical etching or ion etching. Next, the wafer is diced into individual "chips", each corresponding to a single integrated circuit. Each chip is subsequently mounted in an individual package.

When a transparent glass plate has to be attached to the front face of the integrated circuit, before the latter is mounted in its individual package, this plate is firstly cut to the desired dimensions (slightly smaller than those of the chip itself) and is then bonded to the upper face of the chip. In what follows, the term "upper face" or "front face" of the chip or of the substrate refers to the face on which the circuit features defining the electronic functions of the image sensor are formed by successive deposition and etching operations. Among these features, there are contact pads for electrical connection with the outside of the sensor, for controlling the sensor and for receiving the signals representing the image. These pads are located on the periphery of the chip and must remain accessible so as to be able to be soldered to connection pins on the package. This is why the transparent glass plate is cut to smaller dimensions than the surface of the chip—the pads on the periphery of the chip must not be covered by the glass plate.

This fabrication technique means that the transparent wafer must be individually bonded to each chip. The bonding step is therefore not a collective step for the entire wafer of multiple chips. To reduce the fabrication costs, it would be desirable for this step to be a collective step. In addition, if the bonding step is carried out collectively before dicing, the transparent plate protects the chip from dust resulting from the dicing operation, something which is not the case when the bonding takes place only after dicing.

However, a collective fabrication technique encounters a fundamental difficulty: if a glass plate is bonded to the wafer, this glass plate will cover all of the chips, that is to say not only the photosensitive matrix and its drivers, but also the contact pads, thereby making access to them difficult.

Collective fabrication techniques for solving this difficulty have already been envisioned. Thus, U.S. Pat. No. 6,040,235 proposes a technique consisting in making, after the transparent plate has been bonded, a trench having oblique sidewalls that cut the pads, followed by deposition of metal in this trench, in contact with the cut portion of the pads. This metal deposited in the trench is up to the upper face of the plate, so as to form new pads, which are accessible. This technique is complicated—it uses process steps that are not conventional in microelectronics and establishing contacts inside the trench is not easy.

Another technique consists in arranging for the contact pads to be located on the rear face of the chip, while still being connected, through the thickness of the semiconductor wafer, to the circuits formed on the front face of the chip. This technique has been used in particular for image sensors having a thinned semiconductor substrate. However, passing contacts from the front face of the substrate (the face of which all the elements of the integrated circuit are produced) to the rear face is difficult and requires, on the one hand, deep etching and, on the other hand, deposition and etching treatments on both sides of the substrate, which is not desirable.

In the particular field of micromachined electromechanical sensors, for example for accelerometers, various bonding techniques have been also proposed for bonding two silicon wafers, such as for example in U.S. Pat. No. 5,668,033. However, these techniques are complicated as they require particular texturing of the two wafers before they are brought into contact.

There is therefore a need for simpler collective fabrication of chips starting from a wafer, which allows a plate to be collectively bonded to the front face of the wafer, while however permitting electrical access to contacts on the sensor via the front face of the latter after the wafer has been divided up into multiple chips.

SUMMARY OF THE INVENTION

To summarize, the invention proposes a process for the collective fabrication of individual structures, each comprising a first and a second superposed element. The first elements are prepared on a first collective structure and the second elements are prepared on a second collective structure. The collective structures are bonded together over the major portion of their facing surfaces, but their surfaces have been prepared beforehand so as to define limited zones where there will be no adhesion. The individual structures are then diced by cutting on the one hand from above and on the other hand from below along different parallel dicing lines, passing through the zones with no adhesion, so that, after the first elements have been diced, surface portions (those lying between the parallel dicing lines) not covered by a second element remain.

More precisely, the invention provides a process for the collective fabrication of structures consisting of two superposed elements that are bonded together, starting from two plates, one of which includes an array of first elements to which second elements belonging to the second plate have to be bonded, the first plate including electronic circuitry elements protected by an insulating protective layer, the process comprising the following operations:

the lower face of the second plate is bonded to the upper face of the first plate, over the major portion of their respective surfaces, but not bonding the zones called "dicing paths" that are formed by etching indentations in the insulating protective layer on the first plate; and the plates are diced into individual structures consisting of two superposed elements, comprising a lower plate element and an upper plate element, the dicing operations comprising at least dicing of an element of the second plate via its topside along a first dicing line passing along a dicing path, and dicing of an element of the first plate, located beneath the element of the second plate, via the underside along a second dicing line passing along the same dicing path but not superposed with the first dicing line, so that a portion of the lower plate element, lying between the two dicing lines, is not covered by the upper plate element, which is bonded to the first element.

The terms "upper plate" and "lower plate" or "upper face" and "lower face" do not imply a particular functionality of these plates or these faces, it being possible for these plates or faces to be active or passive.

The lower plate element may then include, on its upper face and in this exposed portion, an electrical contact (or several contacts) for access to the structure, the lateral spacing between the two dicing lines being greater than the width of this contact (typically the width of a contact pad on an integrated circuit is a few tens of microns and the lateral spacing between dicing lines may be at least about a hundred microns). If the lower plate element is an integrated circuit chip, the contact is on the front face of the chip, that is to say the face on which the deposition and etching operations are carried out so as to form the electronic circuits of the chip.

The first plate elements may be integrated electronic circuits having any electronic function. The structure consisting of two superposed elements is a purely electronic or optoelectronic structure or a micromachined structure having both mechanical and electronic functions (MEMS) or optical functions (MOEMS). The elements of the second plate may be optical elements to be combined with the elements of the first plate, namely either simple transparent protective wafers or wafers having more sophisticated functions (filtering, color filter mosaics, lenses, arrays of microlenses, fiber optic wafers, scintillator structures with or without a fiber wafer for X-ray imaging, etc.).

In the fabrication of an image sensor or image display comprising an integrated circuit chip covered with an individual optical structure, it will be understood that the first element is the sensor or display chip, the first plate is a semiconductor wafer, on which an array of identical chips arranged in rows and columns is formed, the second plate may be a simple transparent plate, not necessarily including etched features, or else the second plate may, as will be seen later, include etched individual features arranged with the same row and column periodicity as the chips of the semiconductor wafer.

Typically, the dicing paths have a width of a few microns, for pads a few tens of microns wide, and the chips have sides of several millimeters, typically five to ten millimeters.

The bonding may be bonding with addition of bonding material (adhesive, braze) or bonding with no addition of material. In particular, it is very beneficial to use direct bonding, by simple molecular adhesion between two surfaces that are highly planar, clean and of low roughness. If the surfaces are highly planar and quite extensive, the bonding force between the plates is very high, especially after an annealing operation. The zones that are not bonded are defined simply in this case by indentations in the surface of one of the plates (or in both of them). The surfaces of the first and second plates are in contact almost everywhere, but are not in contact in the indentations so that the adhesion between the plates takes place everywhere except in the zones in the indentations. The bonding may also be performed by thermal bonding, anodic bonding, fusion bonding, etc.

The dicing along the dicing paths is in principle performed by a mechanical saw, but it may be envisioned also to dice using a laser, chemical etching, plasma etching, electrical discharge machining, etc.

The dicing of the first plate takes place in principle, for each dicing path, along a single fine dicing line passing through the dicing path between two rows of chips. The width of the dicing line, that is to say the width of the saw blade if it is a saw that performs the dicing, is small, typically about 30 to 50 microns in width.

However, there are several possibilities as regards the second plate:

dicing along a single fine dicing line passing through the dicing path between two rows of chips, this line being parallel to (but not superposed with) the dicing line of the first plate;

or dicing along two parallel fine dicing lines passing through the dicing path between two rows of chips, these lines being parallel to the dicing line of the first chip but at least one of them not being superposed with the latter; in this second case, that portion lying between the two dicing lines of the second plate is scrap, which is removed and does not form part of the final structure consisting of two superposed elements;

or else dicing of the second plate with a larger kerf width than the width of the fine dicing line of the first plate. In this case, this kerf is considered according to the invention to have at least one edge that is laterally offset relative to the dicing line of the first plate, and it is this edge that constitutes the second plate dicing line, not superposed with the first plate dicing line. Here again, after dicing, the first plate element includes a part not covered by the second plate element that is bonded to it. This exposed part contains at least one external connection pad.

BRIEF DESCRIPTION OF THE DRAWINGS

Other features of the invention will become apparent on reading the following detailed description, given with reference to the appended drawings in which.

DETAILED DESCRIPTION OF THE DRAWING

The invention will be described in detail with regard to a simple example, which is an image sensor formed by a silicon chip covered with a transparent glass plate, the glass plate leaving the contact pads on the chip accessible so as to allow electrical connections between the chip and the outside of the sensor. The invention, however, is not limited to this particular example.

The process starts with a semiconductor wafer (in principle a single-crystal silicon wafer) on which are fabricated, by conventional deposition and photoetching processes, an array of identical chips, in rows and columns, each corresponding to a respective image sensor. The suffix n is assigned to a chip of row n of the array, the suffix n−1 is assigned to an adjacent chip on one side and the suffix n+1 to an adjacent chip on the other side. Each chip $P_n$ has an active zone $ZA_n$ comprising a matrix of photosensitive elements and associated electronic drivers. Placed on the periphery of this active zone and to the outside of the latter are conducting contact pads $PL_n$ that will subsequently be connected, after the wafer has been diced into individual chips and during encapsulation of the chip in a protective package, to terminals on the package. The connection between the contact pads and the external terminals is generally made by gold or aluminum wires bonded on one side to the contact pads and on the other side to the package.

The distinction, made here between active zone and zone containing contact pads, does not of course mean that there is no active element outside the active zone. This distinction is made only for distinguishing a zone containing external connection pads from a zone that does not contain them, the zone that does contain the pads being located on the periphery of the zone that does not.

Figure 1A:
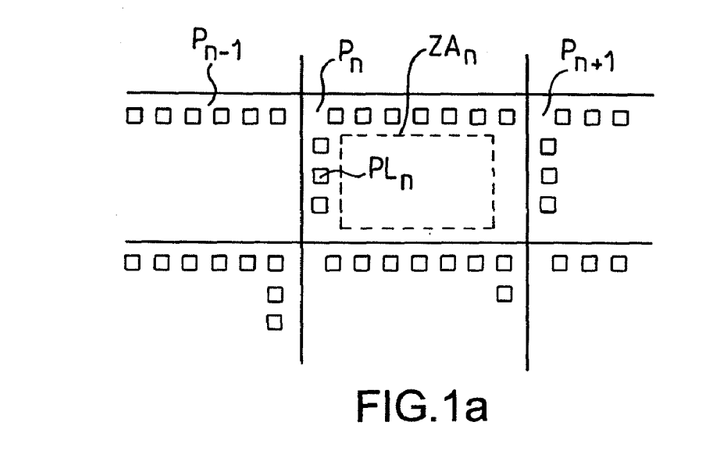
FIG. 1 shows a silicon wafer seen from above in two contact pad configurations for the individual chips on the wafer.
Figure 1B:
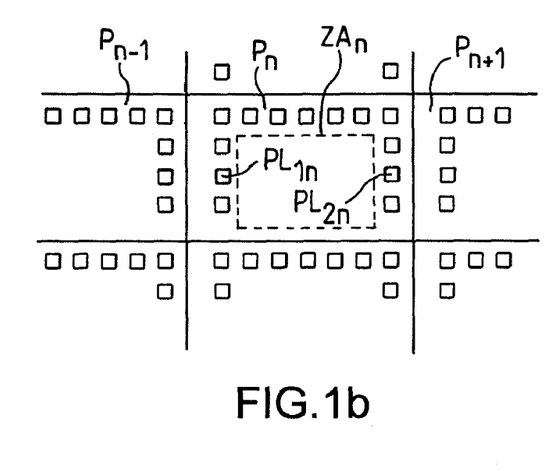

The contact pads may be placed along one or several sides of the chip. In FIG. 1A, the pads are placed only along two adjacent sides of the chip, but not on two opposed sides. In FIG. 1B, the pads are placed at least on two opposed sides of the chip, so that pads $PL1_n$ on the chip $P_n$ are facing pads on the chip $P_{n-1}$ along a side that separates the chip $P_n$ from the chip $P_{n-1}$, and in the same way, on the opposite side, pads $PL2_n$ on the chip $P_n$ face pads on the chip $P_{n+1}$ along a side that separates the chip $P_n$ from the chip $P_{n+1}$. As an example, FIG. 1b shows pads on three sides of the chip. The fabrication process depends on the arrangement of the pads, as will be seen later.

Figure 2:
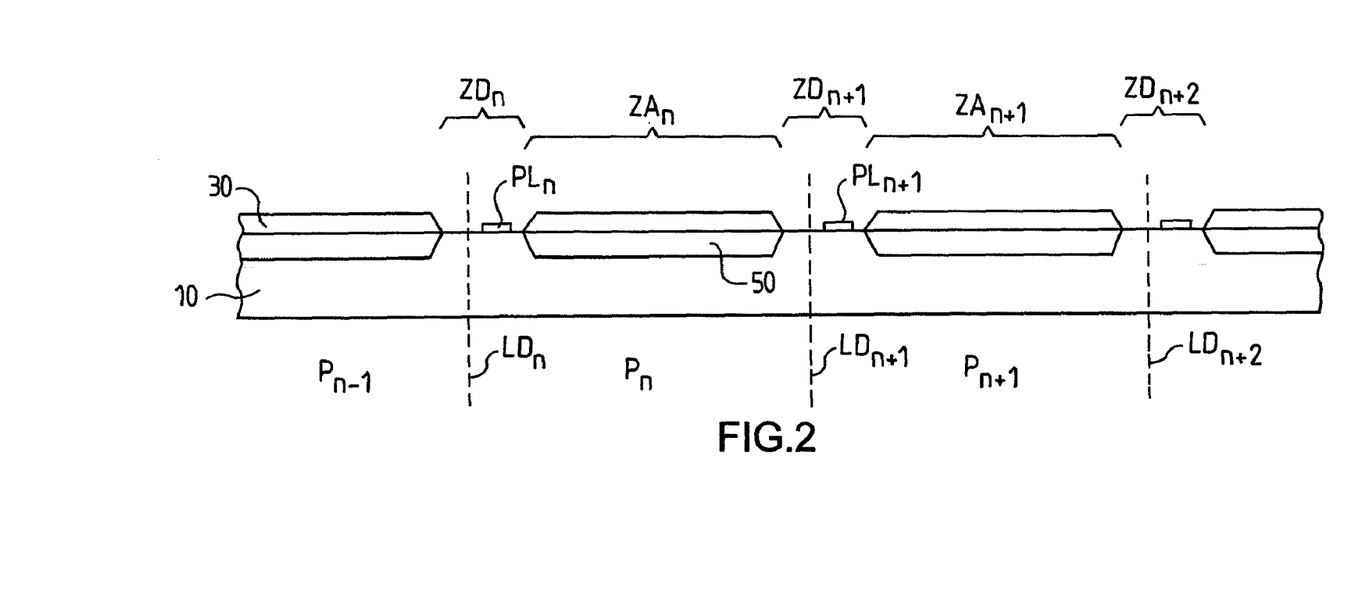
FIG. 2 shows the silicon wafer in cross section, seen enlarged.

FIG. 2 shows, in enlarged view, a cross section through the silicon wafer 10 with juxtaposed chips having pads only on one side or on two adjacent sides, but not on two opposed sides. As in FIG. 1, the adjacent chips are denoted by $P_{n-1}$, $P_n$, $P_{n+1}$ and the active zone of the chip $P_n$ is denoted by $ZA_n$. A contact pad $PL_n$, lying outside the active zone, has been shown schematically. The details of the features of the active zone have not of course been shown. These features may contain hundreds of thousands of circuit elements, produced essentially by conventional operations of depositing insulating, semiconductor and conducting layers on the front face of the wafer (the upper face lying to the top in FIG. 2) and photoetching of these layers. To simplify the respresentation, the circuits of each active zone are shown schematically in FIG. 2 by a respective rectangle 50.

After the sensors have been fabricated, an operation called "planarization" may be carried out on the surface of the wafer. This is because the operations of depositing and etching the various, conducting, insulating or semiconductor layers have created a relief on the wafer (not visible in FIG. 2), and this relief is preferably eliminated as far as possible, so as to end up with a wafer surface that is as planar as possible over the major portion of its surface. In practice, the planarization operation essentially consists in covering the wafer with a protective layer 30 (in general made of silica) a few microns in thickness, which fills the recesses of the relief, and then this layer is uniformly etched so as to leave only a desired thickness thereof, this being chosen so as to provide sufficient protection of the sensor from attack by the external environment. Planarization is not obligatory, but in general an insulating layer such as 30 is used on the surface of the wafer and in what follows this layer will be called "planarization layer".

Conventionally, before or after the planarization operation, apertures are made in the layer 30 so as to bare at least the center of the contact pads and thus make them accessible for subsequently soldering a conductor wire. However, in the invention, wider apertures will be made, overlapping the contact pads but also zones adjacent the contact pads. More precisely, these apertures extend over the entire width of zones that will be called "dicing paths", occupying the space separating the active zone $ZA_n$ of a chip $P_n$ from the active zone $ZA_{n-1}$ or $ZA_{n+1}$ of an adjacent chip. The dicing path between the chips $P_{n-1}$ and $P_n$ is denoted by $ZD_n$.

The dotted lines in FIG. 2 represent dicing lines $LD_n$, $LD_{n+1}$, $LD_{n+2}$ along which the wafer is diced so as to be divided up into individual chips. The thickness of the kerfs is considered to be negligible in FIG. 2. In practice, they are about 30 to 50 microns in width. The cutting lines $LD_n$ pass through the dicing paths $ZD_n$, between the pads $PL_n$ of a chip $P_n$ and the active zone of the adjacent chip $PL_{n-1}$. These dicing lines should be imagined as the wire blade of a vertical saw that moves by advancing along a dicing path. In practice, the dicing paths are perpendicular bands lying between the rows and between the columns of chips in a regular array.

The planarization layer is completely removed in the dicing paths.

The wafer fabricated in the stage shown in FIG. 2 therefore includes chips, pads, active zones and dicing paths lying between the active zones of adjacent chips. The active zones are covered with a planar protective layer. The dicing paths overlap the pads and are stripped by locally removing the planarization layer 30 so as to bare the pads. The planes of the subsequent dicing will pass through the dicing paths, between the pads of one chip and the active zones of an adjacent chip.

Figure 3:
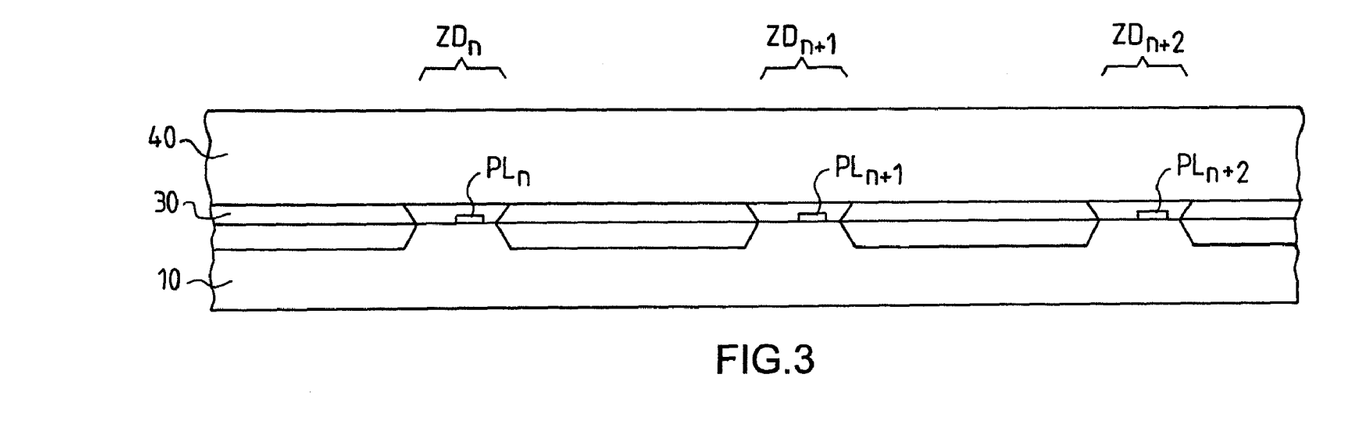
FIG. 3 shows the superposed assembly of the wafer and a transparent glass plate bonded by molecular adhesion.

FIG. 3 shows the next step of the fabrication. To protect the chip or to provide another optical function, the wafer is covered with a plate that corresponds to this protective function or this optical function. In this example, this is simply a transparent glass plate 40 of uniform thickness, but it will be understood that the plate may be prepared with a pattern of functions (for example optical functions) corresponding to the pattern of chips prepared on the semiconductor surface. The thickness of the plate is for example of the order of 1 mm.

The lower surface of the glass plate 40 and the upper surface of the wafer 10 are extremely planar and can be bonded directly to each other by molecular adhesion. Bonding by molecular adhesion is advantageous in that it does not require the addition of bonding material, which runs the risk of spilling over in the dicing paths and in particular on the pads, and being unable to withstand temperatures above 200° C. Adhesion takes place over practically the entire area of these surfaces, but there is no adhesion in the dicing paths ZD owing to the fact that, since they are indented relative to the surface of the planarization layer 30, they are not in contact with the plate. At this stage, it should be noted that it is also possible to provide indentations in the glass plate rather than in the silicon wafer, in the same zones, which are the dicing paths, and obtain the same result, namely no adhesion in the zones. However, this then requires the dicing paths etched in the glass plate to be in exact alignment with the chips to be diced on the wafer, and this solution does not dispense with etching the planarization layer since it is necessary in any case to bare the contact pads.

Figure 4:
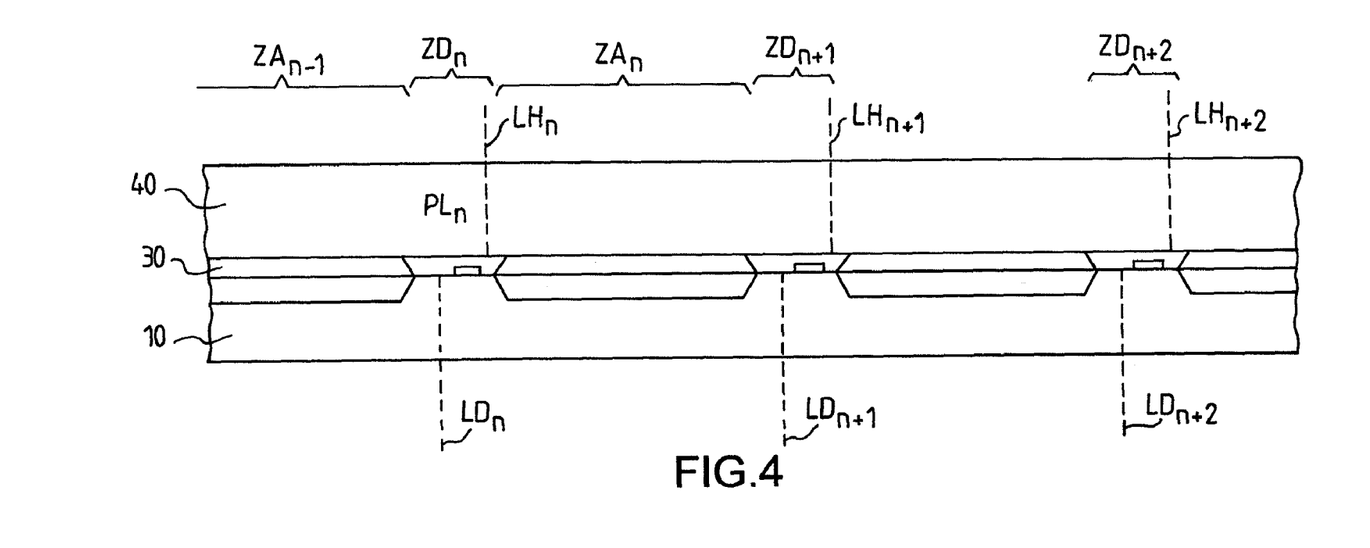
FIG. 4 shows the upper and lower dicing lines of the superposed assembly.

FIG. 4 shows the dicing lines of the bonded structure thus obtained. There are two dicing lines in each dicing zone $ZD_n$, the dicing line already mentioned, $LD_n$, of the lower semiconductor wafer and a dicing line $LH_n$ of the upper plate. These lines both lie in the dicing path, but they are laterally offset one with respect to the other. The dicing line $LD_n$ of the wafer 10 passes, as was mentioned, between the active zone $ZA_{n-1}$ of the chip $P_{n-1}$ and the pads $PL_n$ of the chip $P_n$. The dicing line $LH_n$ of the upper plate 40 passes between the pad $PL_n$ and the active zone $ZA_n$ of the same chip $P_n$. The spacing between the lines is greater than the width of a contact pad.

The dicing along the dicing line $LH_n$ is performed via the upper face of the upper plate while the dicing along the line $LD_n$ is performed via the lower face of the lower plate.

Figure 5:
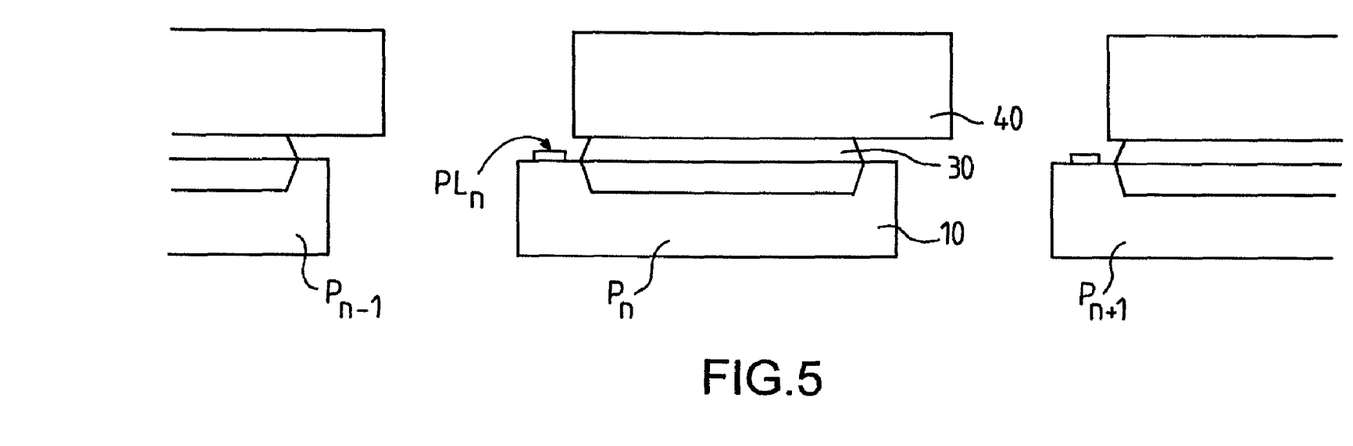
FIG. 5 shows the individual superposed structures that result from the dicing.

FIG. 5 shows superposed structures of a chip (lower plate element) and a glass plate (upper plate element) that result from this double dicing operation. The transparent wafer covers essentially the entire upper surface of the chip and strongly adheres to this entire surface, except in the part corresponding to the dicing part. The pads $PL_n$ are completely accessible, being covered neither by the glass plate 40 nor by the planarization layer 30.

On that side of the chip not having the pads $PL_n$ (right-hand side of the chip in FIG. 5), the glass plate extends beyond the chip.

Figure 6:
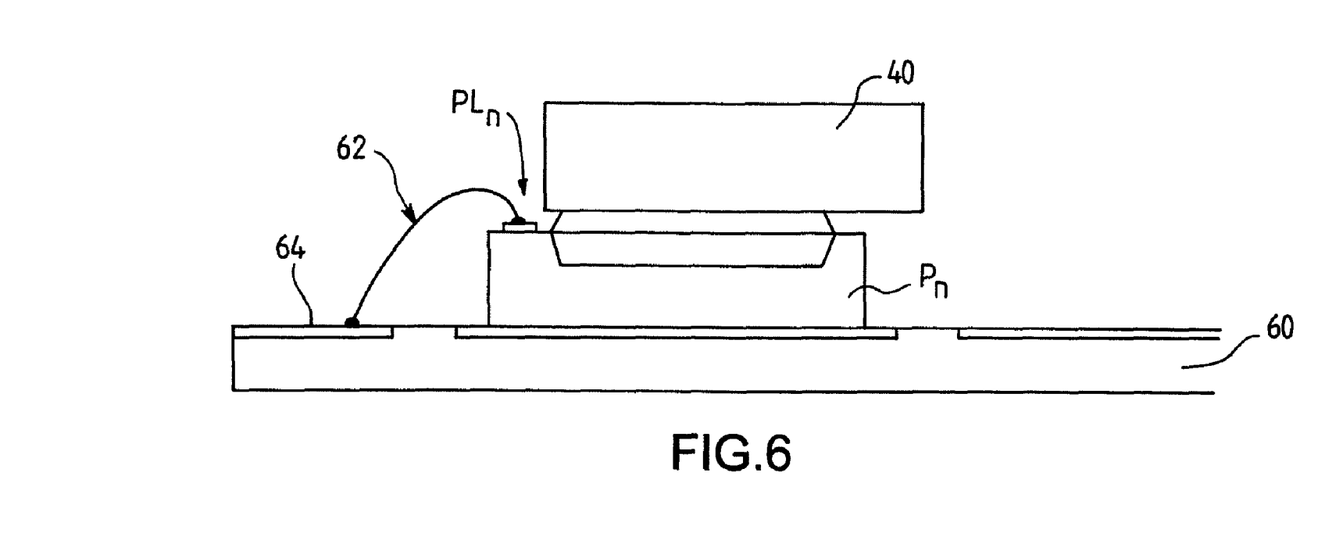
FIG. 6 shows the mounting of a structure on a package with an electrical connection between the structure and the package.

FIG. 6 shows the mounting of the chip, protected by its transparent plate, on an encapsulation package base 60. The chip is bonded via its lower face to the base (in general on a conducting surface provided on the base), and conducting wires 62 are conventionally wire-bonded between the pads $PL_n$ on the chip and corresponding pad 64 provided on the base, the latter pads being in principle connected to pins for external connection of the component thus produced.

In the example shown in FIGS. 4 to 6, the dicing lines are considered to be obtained by a saw (or another cutting instrument) resulting in a very fine kerf width (less than 50 microns) and in all cases smaller than the width of the contact pads that it is desired to leave visible on the lower plate element.

Figure 7:
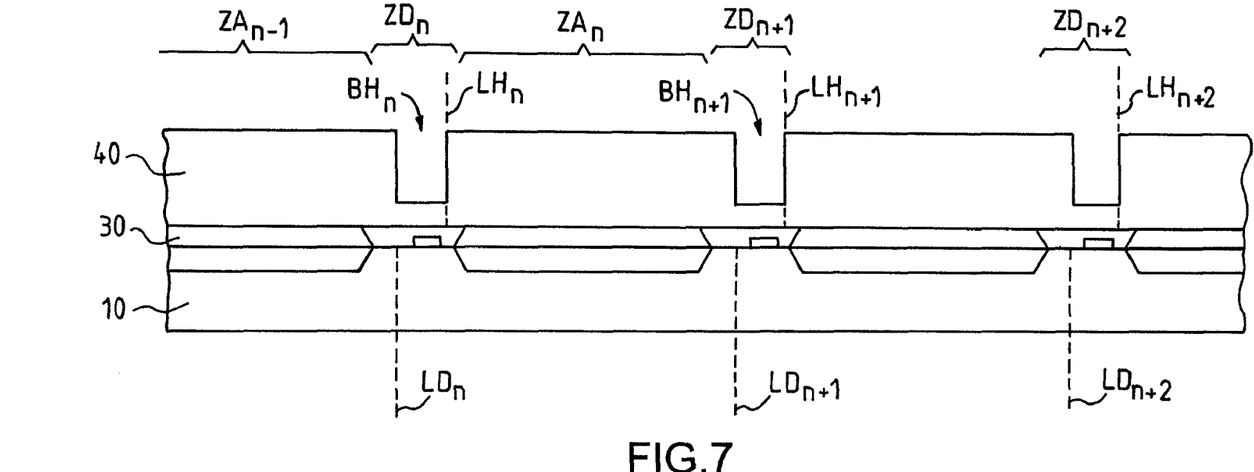
FIG. 7 shows a dicing of the upper plate with a wide kerf that overlaps the contact pads.

FIG. 7 shows another way of proceeding, which consists in using a saw blade (or another cutting instrument) of larger width, approximately equal to the width of the part that it is desired to leave exposed on the lower plate element. FIG. 7 shows the dicing initiation resulting from the use of a wide kerf. The fine dicing line $LD_n$ of the lower plate is not modified. The wide dicing strip $BH_n$ of the upper plate includes, on one side, an edge that is formed by the same dicing line $LH_n$ as in the case of FIG. 4 and is laterally offset relative to the line $LD_n$ and, on the other side, an edge $LH'_n$ which may or may not be offset relative to the line $LD_n$. In this case, the dicing strip $BH_n$ between the dicing lines $LH_n$ and $LH'_n$ overlaps the contact pads, which must remain uncovered by the upper plate element. The advantage of this solution is that, after dicing, that side of the component not having visible pads does not include a portion of the second plate overhanging above the first plate. However, it should be noted that it may sometimes be preferable to have an overhang if it is desired also to take a contact on the lower face of the upper plate (beneath the overhang).

Figure 8:
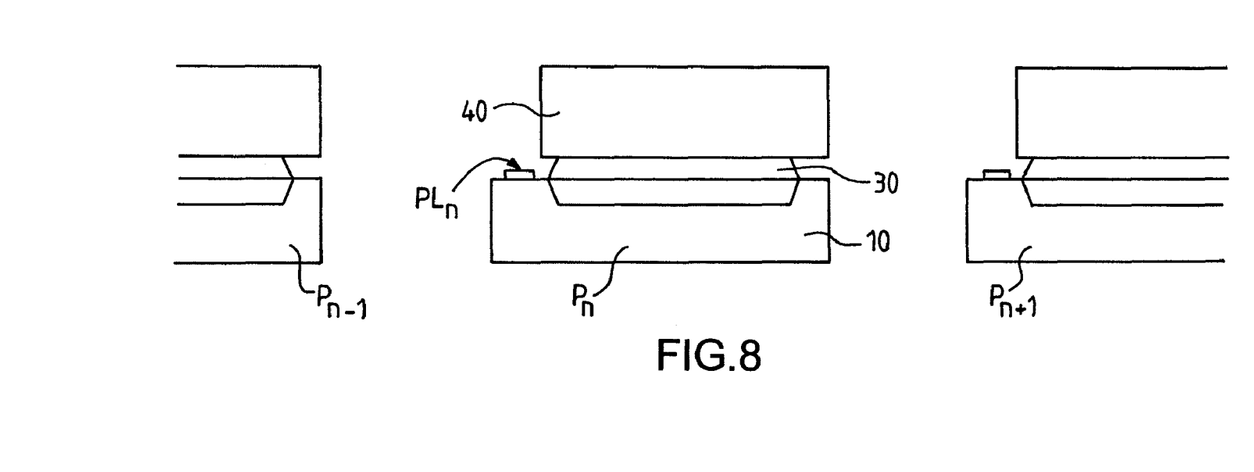
FIG. 8 shows the individual superposed structures that result therefrom.

FIG. 8 shows the resulting component after dicing when the line $LH'_n$ is superposed with the line $LD_n$.

Figure 9:
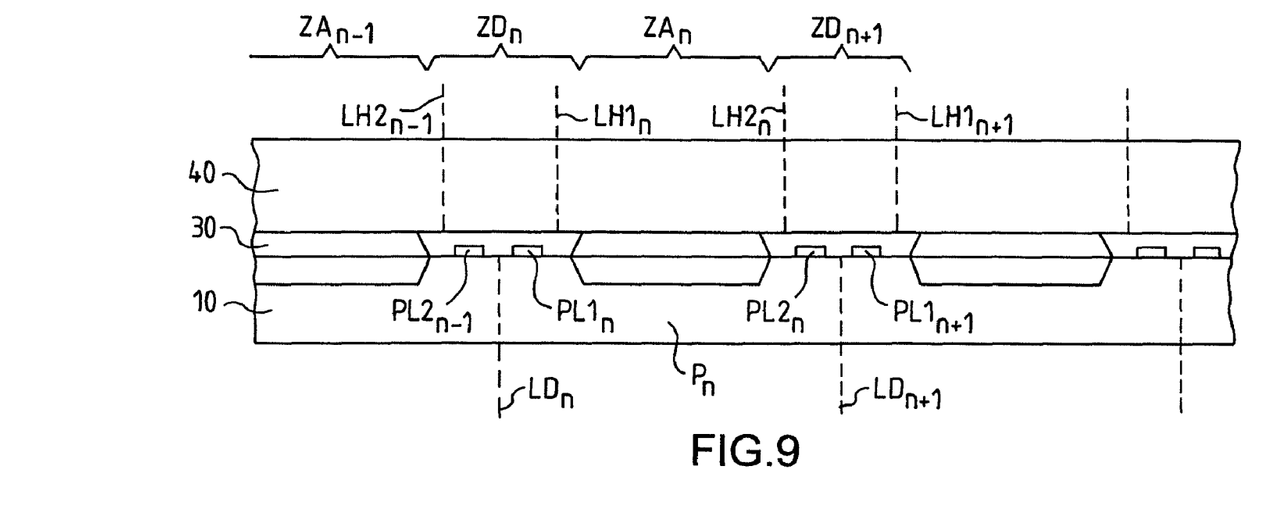
FIG. 9 shows the superposed assembly of a semiconductor wafer and a protective plate, with the corresponding dicing lines, in the case of an electronic chip having contact pads on the two opposed sides of the chips.

FIG. 9 shows a superposed wafer and plate in the case in which the chip includes pads on its two opposed sides, as shown in FIG. 1b. The pads are denoted by $PL1_n$ on the left-hand side of the chip $P_n$ and by $PL2_n$ on the right-hand side. In this case, the dicing path $ZD_n$ between the chip $P_n$ and the chip $P_{n-1}$, which again extends in the entire space separating the active zone of the first chip from the active zone of the second chip, extends both above pads $PL2_{n-1}$ of the chip $P_{n-1}$ and above pads $PL1_n$ of the adjacent chip $P_{n-1}$.

The dicing line $LD_n$ of the wafer between the chips $P_n$ and $P_{n-1}$ passes through the dicing path $ZD_n$ between the pad $PL2_{n-1}$ of the chip $P_{n-1}$ and the pad $PL1_n$ of the chip $P_n$.

To define the dicing of the upper plate 40, there are this time two separate parallel dicing lines, a line $LH1_n$ and a line $LH2_n$ respectively. The first passes through the dicing path between the active zone $ZA_n$ of the chip $P_n$ and a pad $PL1_n$ of this same chip, while the second lies within the same dicing path $ZD_n$ between the pad $PL2_{n-1}$ of the chip $P_{n-1}$ and the active zone $ZA_{n-1}$ of the same chip. The dicing lines $LH1_n$ and $LH2_n$ are in neither case superposed with the dicing lines $LD_n$ or $LD_{n+1}$ of the lower plate.

As in the explanations relating to FIGS. 3 and 4, the dicing path is formed after the planarization operation, by local removal of the planarization layer 30 throughout the dicing path. This firstly creates an indentation in the surface of the wafer over the entire path and, secondly, bares the contact pad. During bonding by molecular adhesion, almost the entire plate strongly adheres to the wafer but in the dicing paths there is no adhesion between the plate and the wafer.

When the wafer has been diced along the dicing paths, in principle firstly via the top and then via the bottom, the double top dicing generates scrap, which is that part of the plate lying between the two dicing lines LH1 and LH2 of the same dicing path.

Figure 10:
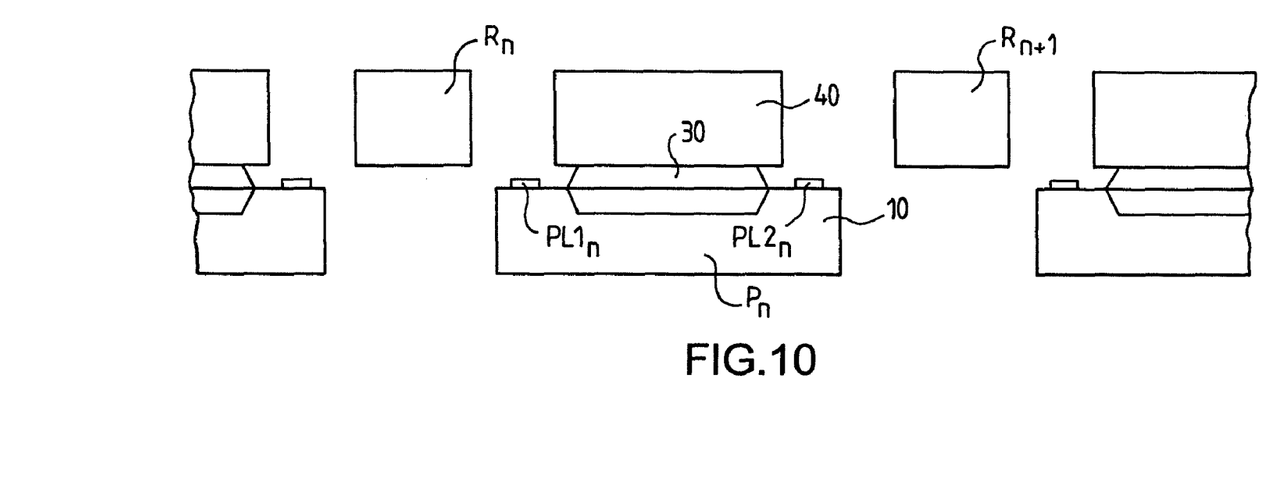
FIG. 10 shows the individual structures resulting from dicing the assembly in FIG. 7.

FIG. 10 shows the two-element structures after the dicing operation. The glass plate that covers each chip does not cover the contact pads, either on one side or on the other, and it does not extend beyond the chip either on the right or on the left. The scrap or residue $R_n$ consisting of the glass plate portion lying between the dicing lines $LH2_{n-1}$ and $LH1_n$ is removed after dicing during a cleaning operation. The glass scrap does not adhere to the semiconductor wafer since it comes entirely from the zone lying between the two dicing lines, which themselves lie entirely within the nonadherent dicing path.

If the chip has pads on only three sides (the case in FIG. 1b), it will be understood that the dicing will be performed as in FIG. 4 for the column dicing paths and as in FIG. 9 for the row cutting paths. On three sides, the glass plate does not project beyond the chip so as to leave the pads accessible, while on the fourth side it may project therefrom. If the chip has pads on four sides, the dicing will be performed as in FIG. 9 for the row dicing directions and for the column dicing directions, and the glass plate will project beyond the chip on none of the sides.

When there are no pads on one of the two opposed sides (the case in FIG. 1a and in FIGS. 3 and 5), it may, however, be desirable for the glass plate not to project beyond the chip, unlike as appears in FIG. 5. In this case, it is sufficient for the dicing to be of the same type as in FIGS. 9 and 10, that is to say double dicing of the glass plate in the same dicing path, leaving a residue $R_n$. Compared to FIG. 4, a second dicing line of the glass plate is provided, similar to the dicing line $LH2_{n-1}$ of FIG. 9 but preferably superposed with the dicing line $LD_n$, thereby eliminating the overhang.

Figure 11:
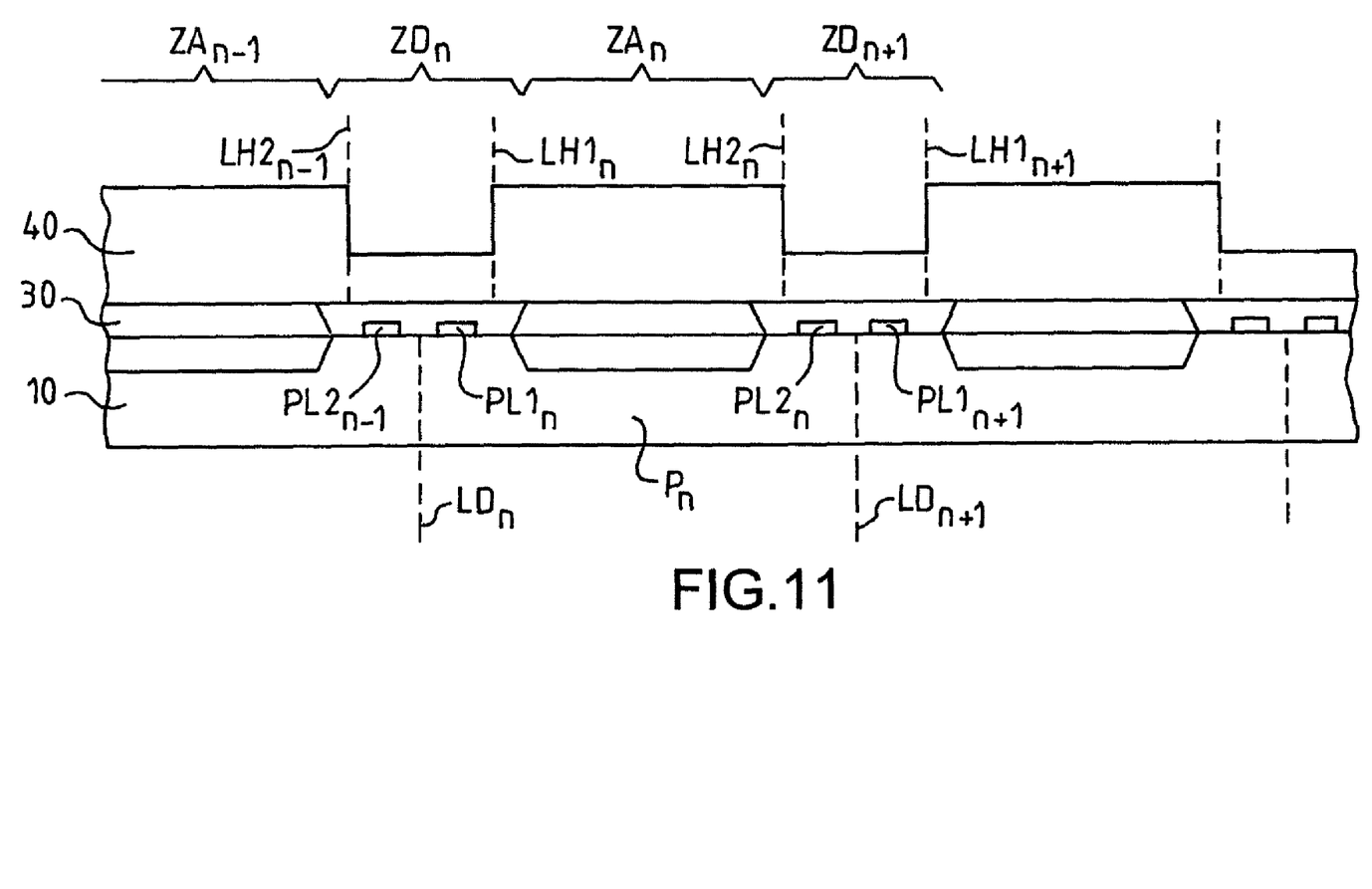
FIG. 11 shows a cross section with a wide kerf.

If the chip has pads on two opposed sides, as shown in FIG. 9 and in FIG. 10, it is also possible to dice the upper plate with a wide kerf in the manner as shown in FIG. 7. In this case, instead of having two neighboring fine dicing lines $LH1_n$ and $LH2_{n-1}$, only a single wide kerf is used, one edge of which is formed by the line $LH1_n$ and another edge is formed by the line $LH2_{n-1}$. FIG. 11 shows the dicing initiation that results from sawing with a wide kerf. The dicing removes the material on top of the pads $PL2_{n-1}$ and $PL1_n$ simultaneously. The component resulting from this dicing is the same as in FIG. 10.

In general, the dicing is performed with a laser or with a saw. It is preferably linear over the entire wafer, the dicing paths being longitudinal bands between rows and columns of individual chips. The dicing may firstly be performed via the top or firstly via the bottom. In practice, the procedure may be as follows: The first dicing is made via the upper face of the transparent plate 40, over a depth that corresponds to the thickness of the plate 40 or slightly less. The dicing is continued via the lower face of the semiconductor wafer, over a depth that corresponds to a thickness equal to or slightly less than the thickness of the wafer 10. If an uncut thickness part remains on the plate or on the wafer, the separation is completed by breaking the plate and wafer along the dicing lines, so as to form individual chips.

In the foregoing, it was considered that the plate and wafer were bonded by molecular adhesion, as this is the preferred method of bonding. This is because, on the one hand the adhesion is strong, owing to the high planarity of the surfaces and owing to the fact that almost the entire area of the facing surfaces are in direct contact with each other, only the narrow dicing paths then not being in direct contact, and, on the other hand, the process is extremely clean since there is no risk of bonding material contaminating the surface of the semiconductor wafer. The operation of bringing the plates into contact is in general followed by an annealing operation, which completes the adhesion.

Figure 12:
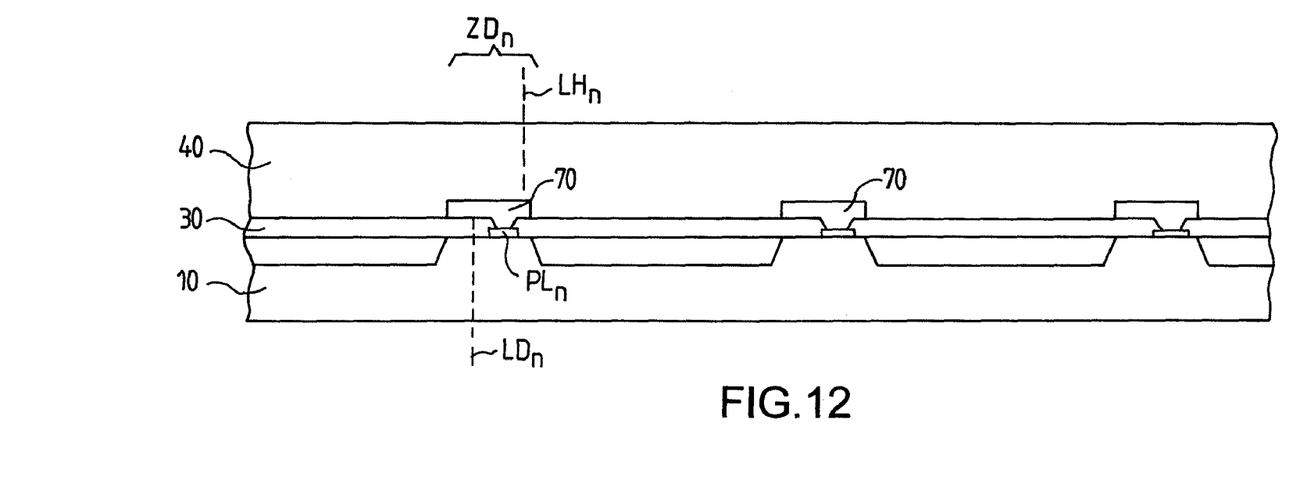
FIG. 12 shows the two plates with dicing paths defined by indentations in the upper plate.

During the operation dicing the plate 40, it is necessary to take care that the laser or saw does not damage the surface of the chip since the dicing line lies above an active part of the chip. This is why, even if the bonding is performed by molecular adhesion, it is preferable to provide, in the plate, large indentations (such as in FIG. 12, for example, several tens of microns in depth) above the dicing paths. The depth of cut may therefore be adjusted so that there is no risk of the cutting tool reaching the semiconductor wafer. This is particularly useful when dicing with a wide kerf is used, as in FIGS. 7 and 11.

Figure 13:
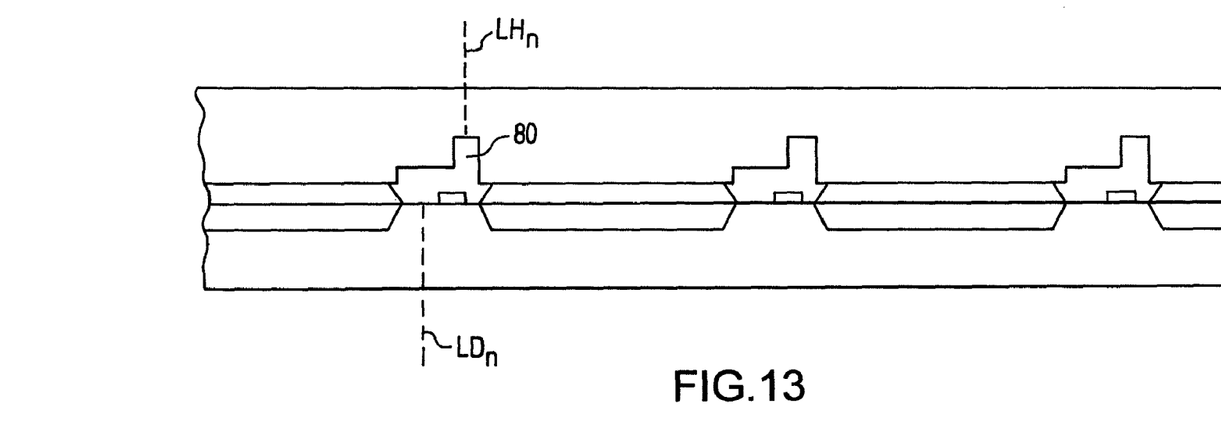
FIG. 13 shows the two plates with dicing paths defined by indentations having two depth levels.

It is also possible to combine shallow indentations, for the purpose of preventing adhesion in the dicing paths and deeper indepentations in the plate 40, for the purpose of preventing the upper surface of the wafer 10 from being damaged by the cutting tool. The deeper indentations 80 are therefore localized at the dicing lines of the glass plate 40. FIG. 13 shows an example of the configuration in a glass plate with indentations having two depths in the dicing paths. If there are two dicing lines in the plate 40 in the same dicing path, there are two deep indentations. The depth may be several tens of microns.

The indentations are made by photolithographic etching or by mechanical machining or laser machining, depending on the desired depth. When the upper plate is placed on the lower plater, the plates are aligned so that the indentations are correctly located relative to the dicing paths. Alignment is particularly simple if the upper plate is transparent.

The invention has thus been described in greater detail in the case of the protection of an image sensor by a transparent glass plate. The invention is also applicable to all kinds of other structures consisting of two superposed elements. The upper plate 40 could be a plate of the same material as the wafer 10 in applications in which the transparency of the plate to visible light is not a key parameter but in which it would be important for the expansion coefficients to be the same and in which it would also be important for the treatments carried out on the upper plate to be of the same nature as those carried out on the lower plate.

The plate may also be a fiber optic wafer.

In the case of radiology, the upper structure element may have a scintillator structure, which converts X-rays into a light image which can be detected by the image sensor (lower structure element). This scintillator structure may be combined with a juxtaposed fiber optic wafer in which the optical fibers are oriented perpendicular to the surface of the sensor. This fiber optic wafer is then covered with a layer of scintillator material.

The glass plate may be replaced with a plate of fused silica or of other materials, depending on the envisioned application. Piezoelectric materials may for example be provided for piezoelectric applications.

The invention claimed is:

1. A process for the collective fabrication of structures having two superposed elements bonded together, starting from two plates, a first lower plate including an array of first elements and a second upper plate including second elements, the first plate including electronic circuitry elements and contact pads and having upper face protected by a planar insulating protective layer covering all of said electronic circuitry elements, said planar insulating protective layer having indentation zones formed by etching a thickness of said protective layer along dicing paths, said contact pads being located within the indentation zones, the process comprising the following steps:

bonding a lower face of the second upper plate to the insulating layer formed on the upper face of the first lower plate, over the major portion of their respective surfaces, but not bonding the indentation zones in the insulating protective layer on the first lower plate; and dicing the first lower and second upper plates into individual structures including said two superposed elements, comprising said first element belonging to said first lower plate and the second element belonging to said second upper plate, the dicing comprising at least dicing of an element of the second upper plate via its topside along a first dicing line passing along a dicing path, and dicing of an element of the first lower plate, located beneath the element of the second upper plate, via its underside along a second dicing line passing along the same dicing path but not superposed with the first dicing line, so that a portion of the first element, including said contact pads, lying between the two dicing lines, is not covered by the second element.

2. The process as claimed in claim 1, wherein the dicing further comprises dicing the second upper plate via its upper side along a third dicing line passing through the same dicing path but not superposed with the first and second dicing lines, the portion lying between the first and third dicing lines constituting scrap not forming part of the two-element superposed structures that result from dicing the plates.

3. The process as claimed in claim 1, wherein the dicing of the second upper plate is performed with a kerf width larger than the dicing width of the first plate, one edge of the wider kerf constituting the dicing line of the second upper plate, which is not superposed with the dicing line of the first lower plate.

4. The process as claimed in claim 1, wherein the first element is an integrated circuit chip and the portion of the first plate element not covered by the second element includes at least one electrical contact pad for access to the electronic circuits formed on the chip, this contact being located on the upper face of the first element.

5. The process as claimed in claim 1, wherein the bonding of the wafers to each other is direct bonding by molecular adhesion between the planar upper face of the first lower plate and the planar lower face of the second upper plate, the indentations preventing local adhesion.

6. The process as claimed in claim 1, wherein the second element is an element for protecting the first element.

7. The process as claimed in claim 1, wherein the second upper plate is a transparent plate.

8. The process as claimed in claim 1, wherein the second upper plate includes an array of individual optical elements, each optical element corresponding to a respective integrated circuit chip formed in the first lower plate.

9. The process as claimed in claim 8, wherein the first element is an image sensor or image display, and the second element is an optical structure associated with this sensor.

10. The process as claimed in claim 9, wherein the structure including two superposed elements is a radiological image sensor, the second element including a fiber wafer and/or a scintillator structure that converts X-rays into a light image which can be detected by the image sensor.

11. The process as claimed in claim 1, wherein the structures including two superposed elements are micromachined structures of the MEMS or MOEMS type which combine electronic functions and mechanical and/or optical functions.

12. The process as claimed in claim 2, wherein the first element is an integrated circuit chip and the portion of the first element not covered by the second element includes at least one electrical contact pad for access to the electronic circuits formed on the chip, this contact being located on the upper face of the element.

13. The process as claimed in claim 3, wherein the lower plate element is an integrated circuit chip and the portion of the lower plate element not covered by the upper plate element includes at least one electrical contact for access to the electronic circuits formed on the chip, this contact being located on the upper face of the first element.

14. The process as claimed in claim 2, wherein the bonding of wafers to each other is direct bonding by molecular adhesion between the planar upper face of the first lower plate and the planar lower face of the second upper plate, the indentations preventing local adhesion.

15. The process as claimed in claim 3, wherein the bonding of wafers to each other is direct bonding by molecular adhesion between the planar upper face of the first lower plate and the planar lower face of the second upper plate, the indentations preventing local adhesion.

16. The process as claimed in claim 4, wherein the bonding of wafers to each other is direct bonding by molecular adhesion between the planar upper face of the first lower plate and the planar lower face of the second upper plate, the indentations preventing local adhesion.

17. The process as claimed in claim 2, wherein the second upper plate is a transparent plate, wherein the transparent plate is a glass or fused silica plate.

18. The process as claimed in claim 3, wherein the second upper plate is a transparent plate, wherein the transparent plate is a glass or fused silica plate.

19. The process as claimed in claim 2, wherein the structures including two superposed elements are micromachined structures of the MEMS or MOEMS type which combine electronic functions and mechanical and/or optical functions.

20. A process for the collective fabrication of structures having two superposed elements bonded together, starting from two plates, a first lower plate including an array of first elements and a second upper plate including second elements, the first plate including electronic circuitry elements and contact pads and having an upper face protected by a planar insulating protective layer covering all of said electronic circuitry elements, said planar insulating protective layer having indentation zones formed by etching a thickness of said protective layer along dicing paths, said contact pads being located within the indentation zones, the process comprising the following steps:

bonding a lower face of the second upper plate to the insulating layer formed on the upper face of the first lower plate, over the major portion of their respective surfaces, but not bonding the indentation zones in the insulating protective layer on the first plate; and dicing the plates into individual structures including two superposed elements, comprising a first element belonging to said first lower plate and a second element belonging to said second upper plate, the dicing comprising at least dicing of an element of the second upper plate along a first dicing line passing along a dicing path, and dicing of an element of the first lower plate, located beneath the element of the second upper plate, along a second dicing line passing along the same dicing path but not superposed with the first dicing line, so that a portion of the first element, including said contact pads, lying between the two dicing lines, is not Ser. No. covered by the second element.

* * * * *